United States Patent [19]

Young

[11] Patent Number: 5,675,256

[45] Date of Patent: Oct. 7, 1997

[54] MAGNETIC RESONANCE METHODS AND APPARATUS

[75] Inventor: Ian Robert Young, Wiltshire, United Kingdom

[73] Assignee: Picker International, Inc., Cleveland, Ohio

[21] Appl. No.: 674,504

[22] Filed: Jul. 2, 1996

[30] Foreign Application Priority Data

Jul. 4, 1995 [GB] United Kingdom ............ 9513544

[51] Int. Cl.$^6$ ............................................. G01V 3/00
[52] U.S. Cl. ..................................... 324/320; 324/318
[58] Field of Search ............................... 324/318, 319, 324/320, 322, 307, 309; 128/653.5

[56] References Cited

U.S. PATENT DOCUMENTS

| | | | |
|---|---|---|---|
| 4,827,235 | 5/1989 | Inomata et al. | 335/297 |
| 5,155,436 | 10/1992 | Suzuki et al. | 324/318 |
| 5,304,932 | 4/1994 | Carlson | 324/318 |
| 5,555,251 | 9/1996 | Kinanen | 324/318 |
| 5,583,439 | 12/1996 | Danby et al. | 324/319 |

FOREIGN PATENT DOCUMENTS

| | | |
|---|---|---|
| 0371775 | 6/1990 | European Pat. Off. . |
| 0379802 | 8/1990 | European Pat. Off. . |
| 0541872 | 5/1993 | European Pat. Off. . |
| 4203036 | 8/1993 | Germany . |
| 2109542 | 4/1990 | Japan . |
| 2152440 | 6/1990 | Japan . |
| 4129531 | 4/1992 | Japan . |
| 6245917 | 6/1994 | Japan . |
| 2264175 | 6/1996 | United Kingdom . |
| 9114948 | 10/1991 | WIPO . |

*Primary Examiner*—Louis M. Arana
*Attorney, Agent, or Firm*—Timothy B. Gurin; John J. Fry

[57] ABSTRACT

A magnetic resonance imaging system includes a magnet system which includes pole pieces and an energizing coil. The end portions of the pole pieces are made from a material which, does not support eddy currents, such as insulated iron powder. An object to be imaged is placed in the gap between the pole pieces. A gradient coil system imposes desired gradient fields in the gap between the pole pieces. The gradient magnetic field sequences are controlled such that, for each gradient pulse or a particular polarity there is applied a compensating pulse of the same magnitude, but the opposite polarity. Each compensating gradient has an integral which is relatively small. Remanent magnetism in the end portions of the pole pieces is thereby substantially avoided.

14 Claims, 2 Drawing Sheets

MAGNETIC RESONANCE METHODS AND APPARATUS

This invention relates to magnetic resonance methods and apparatus.

More particularly the invention relates to magnetic resonance methods and apparatus for the examination of an internal region of a body, for example, an internal region of the body of a live human patient for medical purposes.

In use of such magnetic resonance methods and apparatus for examining the body of a live human patient for medical purposes, e.g. to obtain image and/or spectroscopic data, the body under investigation is placed in a homogeneous static magnetic field to define an equilibrium axis of magnetic alignment in the region of the body being examined. A radio frequency (r.f.) magnetic field is then applied to the region being examined in a direction orthogonal to the static magnetic field direction to excite magnetic resonance in material, typically in hydrogen protons, in the region, and the resulting r.f. signals are detected and analysed. During this sequence of operations one or more gradients are normally imposed on the static magnetic field to cause excitation of magnetic resonance preferentially in the region of the body to be examined, to encode spatially the detected r.f. signals, and also for other purposes such as flow encoding.

In such methods and apparatus the static magnetic field may be applied by means of an iron-yoked permanent or electromagnet, the body to be examined being placed in a gap between opposed faces of a apir of a apir of pole pieces joined by the yoke. In such an arrangement gradients imposed on the static magnetic field are conveniently produced by coils disposed in the gap adjacent the pole pieces and lying generally in planes parallel to the opposed faces of the pole pieces.

One problem which arises with such an arrangement is that flux from the gradient coils penetrates the pole pieces and generates eddy currents in the pole pieces. As a result, the field in the pole pieces can become locally distorted with resulting deterioration of the homogeneity of the field in the gap and hence in the body under examination.

One way to overcome this problem is to actively shield the gradient coils so as to prevent flux from the gradient coils entering the pole pieces. However, such shielded gradient coils occupy an appreciable volume within the gap between the pole pieces with the result that, to accommodate a body of given size, the width of the gap between the pole pieces must be increased, with resulting increase in weight and cost of the magnet producing the static magnetic field.

It is an object of the present invention to provide an alternative way of overcoming this problem.

According to one aspect of the present invention there is provided magnetic resonance apparatus including a magnet system incorporating two pole pieces having opposed surfaces which define a gap in which a body to be examined is placed in use of the apparatus, the magnet system producing a static magnetic field in the gap which defines an equilibrium axis of magnetic alignment in the body, and the apparatus further including a gradient coil arrangement whereby at least one gradient may be superimposed on the magnetic field in the gap; characterised in that at least the portions of said pole pieces adjacent said surfaces comprise a magnetic material which does not support eddy curents and means is provided for controlling the energising currents supplied to the gradient coil arrangement in such a manner as to avoid significant remanent magnetism in said magnetic material when the gradient coil arrangement is not being supplied with energising current.

According to a second aspect of the invention there is provided a method of examining a body using a magnetic resonance technique comprising: disposing the body in a magnetic field extending across a gap between opposed surfaces of a pair of pole pieces of a magnet system so as to define an equilibrium axis of magnetic alignment in the body, at least the portions of the pole pieces adjacent said surfaces comprising a material which does not support eddy currents; applying a radio frequency field to a body in said gap to excite magnetic resonance in said body; detecting r.f. signals emitted by the body in consequence of the excited magnetic resonance and analysing the detected signals to derive data relating to the body; during an excitation and detection sequence, applying a sequence of energising currents to a gradient coil arrangement to impose a desired sequence of gradients on the magnetic field in the gap; and controlling the magnitudes of the applied energising currents so that there is substantially no remanent magnetism in said material at the end of an excitation and detection sequence.

One magnetic resonance apparatus and method in accordance with the invention will now be described, by way of example, with reference to the accompanying drawings in which.

Figure 1:
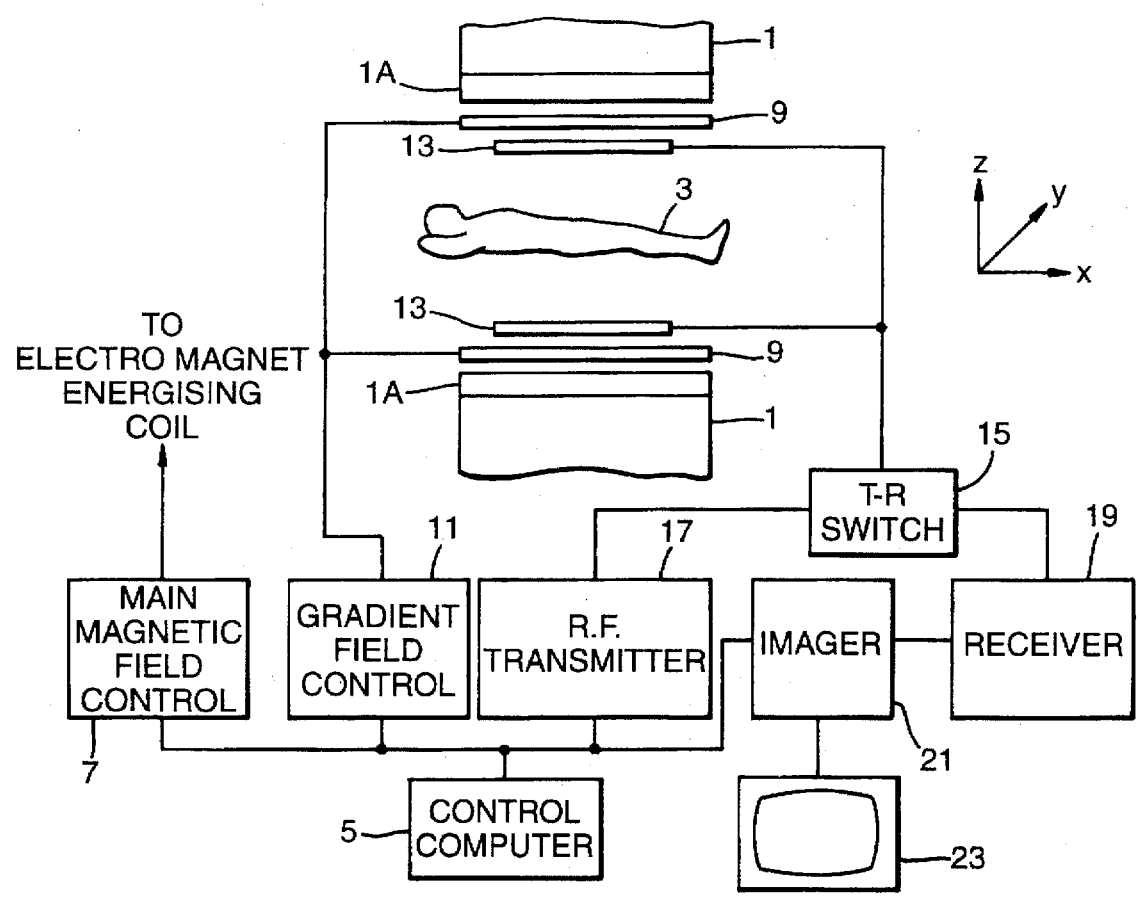
FIG. 1 is a schematic diagram of the apparatus.

Referrring to FIG. 1, the apparatus, which is a diagnostic patient imaging apparatus, includes an electromagnetic system which produces a strong uniform static magnetic field Bo across a gap between two pole pieces 1 of the electromagnet system, the pole pieces I being joined by a yoke (not shown) carrying an energising coil (not shown). In use of the apparatus a patient 3 to be imaged is placed in the gap between the pole pieces on a suitable support (not shown) so that the head-to-toe axis of the patient is orthogonal to the direction of the magnetic field Bo in the gap between the pole pieces.

The strength of the field in the gap between the pole pieces 1, and hence in the patient 3, is controlled by a computer 5 via a main magnet control means 7 which controls the supply of energising current to the electromagnetic energising coil.

The apparatus further includes a gradient coil system 9 whereby a gradient may be imposed on the static magnetic field in the gap between the pole pieces 1 in any one or more of three orthogonal directions x, y and z. The coil system 9 is energised by currents supplied by a gradient field control means 11 under control of the computer 5.

The apparatus further includes an r.f. antenna system 13. The antenna system 13 is selectively connectable by way of a transmit-receive (T-R) switch 15 either to an r.f. transmitter 17 or a receiver 19. The transmitter 17 is operated under control of the computer 5 to apply r.f. field pulses to the patient 3 for excitation of magnetic resonance in the patient 3. R.f. signals resulting from magnetic resonance excited in the body are sensed by the antenna system 13 and passed via the receiver 19 to an imager 21 which under control of the computer 5 processes the signals to produce signals representing an image of the patient 3. These signals are, in turn, passed to a display device 23 to provide a visual display of the image. Instead of using a T-R switch the antenna system 13 may comprise separate transmitting and receiving coil arrangements respectively connected with transmitter 17 and receiver 19.

In operation of the apparatus the field provided by the electromagnet defines an equilibrium axis of magnetic alignment in the region of interest of the patient 3.

To obtain an image of a selected region of the patient's body, an r.f. field pulse is first applied to the body by means of the r.f. transmitter 17 and antenna system 13 to excite magnetic resonance in the selected region. To this end the antenna system 13 produces a field B1 in a direction orthogonal to the static field direction so as to tip the spins of nuclei in the selected region from the direction of the static field into a plane orthogonal to the static field direction. To restrict excitation to the selected region the r.f. field pulse is applied in conjunction with magnetic field gradients imposed by the coil system 9, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields, detected by the antenna system 13 and processed to produce an image.

Normally a number of excitation and signal detection sequences are required to produce sufficient data to produce a satisfactory image.

It will be appreciated that, due to the proximity of the gradient coil system to the pole pieces 1, gradient fields will penetrate into the pole pieces in operation of the apparatus.

In accordance with the invention, in order to prevent such penetrating fields producing significant eddy currents in the pole pieces, with resultant distortion of the magnetic field in the gap between the pole pieces and hence of the images obtained, the end portions 1A of the pole pieces 1 are made of a material which does not support eddy currents. Suitable materials are insulated iron powders, for example, iron epoxy compositions such as those supplied by Hoganäs AB of Hoganäs, Sweden.

It will be appreciated that materials of this nature exhibit a relatively high degree of magnetic hysteresis. As a result, unless .special steps are taken, a complex pattern of magnetisation can remain in the material at the end of an excitation and detection sequence which will result in degradation of the homogeneity of the static field in the gap and hence of the images obtained.

This problem is overcome in accordance with the invention by arranging that, in the gradient magnetic field sequences, for each required gradient pulse of a particular polarity there is applied a compensating pulse of the same magnitude, but the opposite polarity. By this means the production of remanent magnetism in the end portions 1A of the pole pieces is substantially avoided. In order to otherwise minimise its effect each such compensating gradient has an integral which is relatively small, i.e. its duration is made as small as is practical. In some cases it may be necessary to alter the duration of the gradient pulse whose remanent magnetisation effect is being compensated so that the altered duration pulse and the corresponding compensation pulse together have a desired integral.

Figure 2:
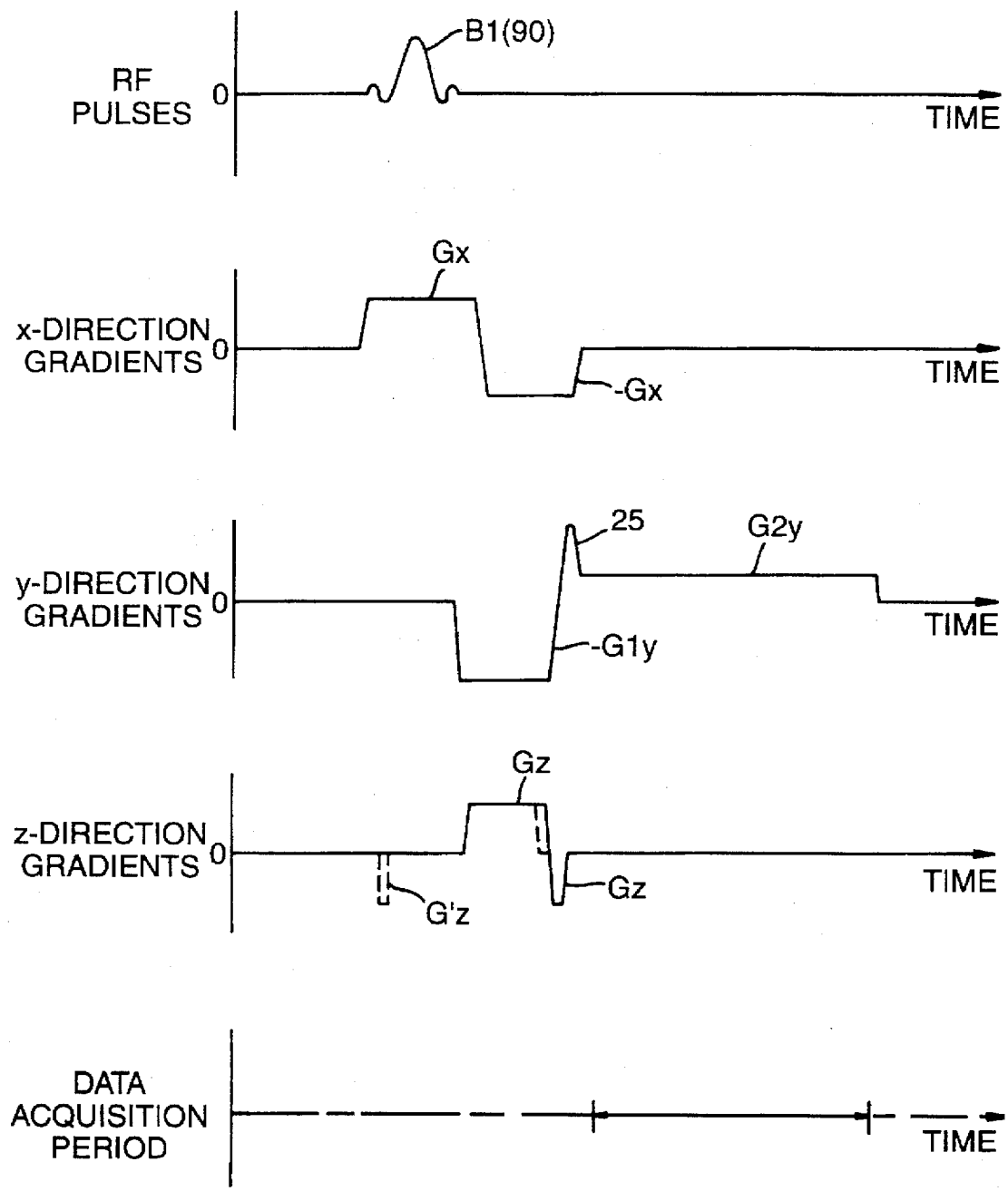
FIG. 2 is a diagram illustrating a sequence of steps carried out in the method.

Referring now to FIG. 2, in one particular method in accordance with the invention for producing images using a two-dimensional Fourier transformation technique, there is used an excitation and detection sequence wherein there is first applied a 90° r.f. excitation pulse B1(90) in the presence of a slice selection gradient. For the purposes of the present example the direction of the static magnetic field in the gap between pole pieces 1 is designated the z-direction and the head-to-toe direction of the patient 3 is designated the x-direction, as illustrated in FIG. 1. The slice selection gradient applied during r.f. pulse B1 (90) is therefore in the x-direction and designated Gx in FIG. 2. The slice selection gradient Gx is followed immediately by a reverse gradient −Gx of the same magnitude but of appropriate shorter duration than the slice selection pulse Gx which serves to compensate in known manner for the variation in the magnetic field across the width of the selected slice during excitation.

Since the pulses Gx and −Gx are of equal magnitude and opposite polarity, no further compensating pulse to prevent x-direction remnant magnetisation in accordance with the invention is required.

After excitation but before detection, e.g. during application of gradient −Gx, a phase encoding gradient Gz is applied, and during detection, i.e. data acquisition, a frequency encoding gradient G2y is applied, as shown in FIG. 2, the detected signal comprising a gradient recalled echo signal. To obtain a full set of data for an image, the excitation and detection sequence is repeated a number of times with a different value of the phase encoding gradient Gz each time. In order to ensure, in known manner, that the detected echo signal occurs at the intended time during the gradient G2y the gradient G2y is preceded by a reverse gradient −G1y.

The gradients −G1y and G2y are required to exhibit different magnitudes and consequently can result in remnant y-direction magnetisation. To prevent this in accordance with the invention, a short initial portion 25 of the gradient G2y has the same magnitude as the −G1y gradient.

Similarly, to prevent z-direction remanent magnetisation resulting from the phase encoding gradient Gz the phase encoding gradient is followed by a short gradient −Gz of opposite polarity to, but the same magnitude as, the phase encoding gradient Gz. Alternatively, if the hysteresis effect is not very large, a short gradient −G'z of the opposite polarity to, but the same magnitude as, the gradient Gz may be applied before excitation, but this requires a reduction in the duration of the gradient Gz, as illustrated by dotted lines in FIG. 2. However care must be taken in this case not to distort slice selection.

What is claimed is:

1. A magnetic resonance apparatus comprising:
    a magnet system comprising two pole pieces having opposed surfaces which define a gap for placement of an object to be imaged, the magnet system producing a static magnetic field in the gap which defines an equilibrium axis of magnetic alignment in the object, at least the portions of the pole pieces adjacent the surfaces comprising a magnetic material which does not support eddy currents;
    a gradient coil arrangement whereby at least one gradient may be superimposed on the magnetic field in the gap; and
    means for controlling the energizing currents supplied to the gradient coil arrangement during the imposition of a desired sequence of gradients on the magnetic field in the gap so as to avoid significant remanent magnetism in the magnetic material at the end of the sequence.

2. An apparatus according to claim 1 wherein the magnetic material comprises an insulated iron powder.

3. An apparatus according to claim 2 wherein said magnetic material comprises an iron/epoxy composition.

4. An apparatus according to claim 1 wherein the magnitudes of the energizing currents are controlled such that, for each imposed gradient of a particular polarity, there is applied a compensating gradient of substantially the same magnitude but the opposite polarity.

5. An apparatus according to claim 4 wherein a sequence of gradients is applied, each of said compensating gradients having a relatively short duration compared with any other gradient applied during the sequence of gradients.

6. An apparatus according to claim 1 wherein a sequence of gradients is applied, the sequence comprising at least one of a frequency and phase encoding gradient sequence.

7. A method of examining an object using a magnetic resonance technique, the method comprising the steps of:

disposing an object in a magnetic field extending across a gap between opposed surfaces of a pair of pole pieces of a magnet system so as to define an equilibrium axis of magnetic alignment in the object, at least the portions of the pole pieces adjacent said surfaces comprising a material which does not support eddy currents;

applying a radio frequency field to the object in the gap to excite magnetic resonance in the object;

applying a sequence of energizing currents to a gradient coil arrangement to impose a desired sequence of gradients on the magnetic field in the gap; and controlling the magnitudes of the applied energizing currents so that there is substantially no remanent magnetism in the material at the end of a sequence.

8. The method of claim 7 wherein the sequence of energizing currents is applied during an excitation and detection sequence and the magnitudes of the applied energizing currents are controlled so that there is substantially no remanent magnetism in the material at the end of an excitation and detection sequence.

9. The method of claim 7 wherein the magnitudes of the applied energizing currents are controlled so that, for each imposed gradient of a particular polarity, there is applied a compensating gradient of substantially the same magnitude but the opposite polarity.

10. The method of claim 9 wherein each of the compensating gradients is of relatively short duration compared with any other gradient applied during the sequence.

11. A method according to claim 7 wherein the sequence of gradients is at least one of a frequency and phase encoding gradient sequence.

12. A method according to claim 7 wherein the magnetic material comprises an insulated iron powder.

13. A method according to claim 7 wherein the magnetic material comprises an iron/epoxy composition.

14. A magnetic resonance apparatus comprising:

a magnet system comprising two pole pieces having opposed surfaces which define a gap for placement of an object to be imaged, the magnet system producing a static magnetic field in the gap which defines an equilibrium axis of magnetic alignment in the object, at least the portions of the pole pieces adjacent the surfaces comprising a magnetic material which does not support eddy currents;

means for applying a radio frequency field to the object in the gap to excite magnetic resonance in the object;

a gradient coil arrangement whereby at least one gradient may be superimposed on the magnetic field in the gap; and means for applying a sequence of energizing currents to said gradient coil arrangement to impose a desired sequence of gradients on the magnetic field in the gap; and means for controlling the magnitudes of the applied energizing currents so that there is substantially no remanent magnetism in the material at the end of a sequence.

* * * * *